United States Patent [19]

Fukui et al.

[11] 4,001,809
[45] Jan. 4, 1977

[54] DISPLAY DEVICE INCLUDING CIRCUITS FOR DRIVING LOADS SUCH AS ELECTROPHORETIC DISPLAYS

[75] Inventors: Kiyotake Fukui, Settsu; Shuichi Ninomiya, Kadoma, both of Japan

[73] Assignee: Matsushita Electric Industrial Co., Ltd., Osaka, Japan

[22] Filed: Jan. 20, 1975

[21] Appl. No.: 543,007

Related U.S. Application Data

[63] Continuation of Ser. No. 379,337, July 16, 1973, abandoned.

[30] Foreign Application Priority Data

July 19, 1972 Japan ............................ 47-72778
July 19, 1972 Japan ............................ 47-72779

[52] U.S. Cl. ...................... 340/336; 340/166 EL; 340/324 M
[51] Int. Cl.² ........................................... G09F 9/32
[58] Field of Search ........ 340/324 M, 166 EL, 336; 350/160 R, 160 P, 160 LC

[56] References Cited

UNITED STATES PATENTS

| 3,653,745 | 4/1972 | Mao ............................ 340/166 EL |
| 3,878,537 | 4/1975 | Roncillat et al. ............. 340/324 M |

*Primary Examiner*—Marshall M. Curtis
*Attorney, Agent, or Firm*—Wenderoth, Lind & Ponack

[57] ABSTRACT

A display device for a display panel which is operated by both polarities of an applied voltage has a segment driving device connected to a segmental electrode of the display panel, a display controlling device connected to the power source, a resistive element connected between the segmental electrode and the display controlling device, and another resistive element connected between the display controlling device and the common electrode of the display panel. The voltage across the segmental electrode and the common electrode is provided by the segment driving device only when the display controlling device is in a short-circuited condition.

6 Claims, 8 Drawing Figures

DISPLAY DEVICE INCLUDING CIRCUITS FOR DRIVING LOADS SUCH AS ELECTROPHORETIC DISPLAYS

This is a Continuation, of application Ser. No. 379,337, filed July 16, 1973 now abandoned.

BACKGROUND OF THE INVENTION

This invention relates to a display device, and more particularly to a display device for driving a display panel which comprises a segmental electrode and a common electrode and which is controlled according to both polarities of an applied voltage.

Conventionally, there are various kinds of electric display devices such as Nixie tubes, liquid crystals, and arrays of LED (light emitting diodes). These display devices are controlled according to only one polarity of an applied voltage.

Recently, there has been introduced a new electrophoretic display device, as disclosed for example by U.S. Pat. No. 3,668,106. The electrophoretic display panel has segmental electrodes and a common electrode, and it is driven by both polarities of the applied voltage. That is, in order to control the operation of the electrophoretic display panel, it is necessary to apply voltage of both polarities. For example, the segmental electrode shows a white color when a positive voltage is applied between the segmental electrode and the common electrode, and shows a black color when a negative voltage is applied therebetween. Even when the applied voltage is withdrawn, the color shown by the electrophoretic display panel at the time the voltage is applied remains. Such a memory characteristic is not possessed by such a conventional display panel as one made up of Nixie tubes, liquid crystals or arrays of LED.

In order for such a novel display panel to be practically useful, it is necessary to provide a novel display device for driving the panel, a device which is simple and effective, which has a small power loss and which is suitable for a display panel driven according to the both polarities of the applied voltage.

SUMMARY OF THE INVENTION

Therefore, an object of the present invention is to provide a novel and improved display device for driving a display panel, by applying positive and negative voltages thereto, for activating and erasing of the panel and for maintaining the indicating condition of the panel during a memory period.

Further object of the invention is to provide a novel and improved display device which has a small power loss and so results in a long life of the display device.

A still further object of the invention is to provide a novel display device having a switching function for effectively changing the colors shown by the segmental electrodes and the background electrode.

A further object of the invention is to provide a novel display device which can drive a plurality of display panels alternately which has a simple and inexpensive configuration.

These objects are achieved by a display device according to the present invention, which comprises a display panel having a segmental electrode and a common electrode, a segment driving device connected to said segmental electrode, a voltage supply means for applying a voltage to said display panel, a display controlling device connected to said voltage supply means, a resistive element connected between said segmental electrode and said display controlling device, and another resistive element connected between said display controlling device and said common electrode of said display panel, wherein a voltage is provided across said segmental electrode and said common electrode by said segment driving device only when said display controlling device is in a short-circuited condition.

BRIEF DESCRIPTION OF THE DRAWINGS

These and other objects and features and advantages of the present invention will be apparent from considering the following description with the accompanying drawings, in which.

DETAILED DESCRIPTION OF THE PREFERRED EMBODIMENTS

Figure 1:
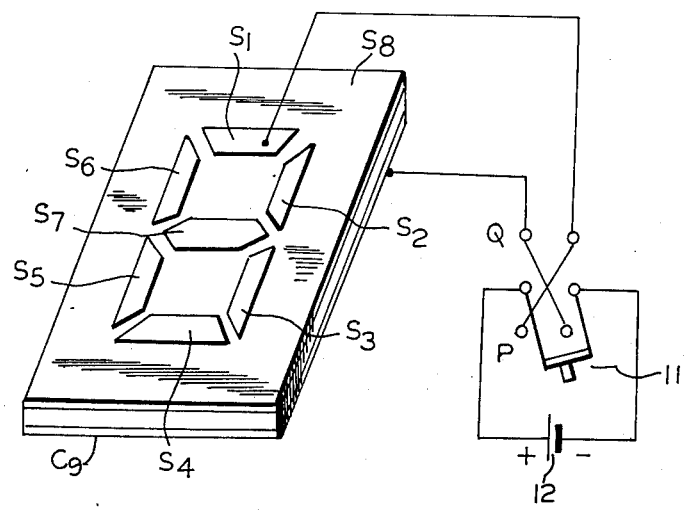
FIG. 1 is a basic schematic diagram for illustrating a method of driving an electrophoretic display panel.

With reference to FIG. 1, there will now be described hereinafter a method of driving an electrophoretic display panel. An electrophoretic display panel which is designated, as a whole, by a reference numeral 10 has a segmented electrode made up of segmental electrodes $S_1$ to $S_7$, a background electrode $S_8$ and a common electrode $C_9$. The segmental electrode $S_1$ and the common electrode $C_9$ are connected to output terminals of a D.C. voltage applying means 12 through a polarity-reversing switching device 11.

The electrophoretic display panel has an electrophoretic suspension layer therein which has two opposite surfaces and includes a dispersion of an electrophoretic material in a finely divided powder form suspended in a suspending medium, as disclosed in U.S. Pat. No. 3,668,106. The two opposite major surfaces of the suspension layer are each in contact with a transparent electrode, respectively, i.e. in case of FIG. 1 $S_1$ and $C_9$, respectively.

Before an electric field is supplied to the suspension layer from the D.C. voltage applying means 12, the electrophoretic material in a finely divided powder form is distributed uniformly throughout the suspending medium. When the electrophoretic material is, for example, white and the suspending medium is, for example, black, the suspension layer appears gray under the illumination of incandescent lamp. When a D.C. electric field is applied to the suspension layer, the electrophoretic material is caused to move electrophoretically in a direction either to a cathode or to an anode depending upon its polarity. For example, if the material has a negative polarity, it moves and is deposited on the anode and has a spatial distribution different from the uniform distribution. That is, in FIG. 1, when the switching device 11 is in the position ($p$), the segmental electrode $S_1$ displays a white color. On the other hand, when a negative D.C. electric field is applied between the segmental electrode $S_1$, and the common electrode $C_9$ by reversing the switching device 11, the segmental electrode $S_1$ displays a black color, the color of the suspending medium, because the electrophoretic material is deposited on the common electrode $C_9$. The operation is the same for the other segmental electrodes $S_2$ to $S_8$, and so there can be provided a display of a numerical pattern by using the display panel 10 of FIG. 1.

Figure 2:
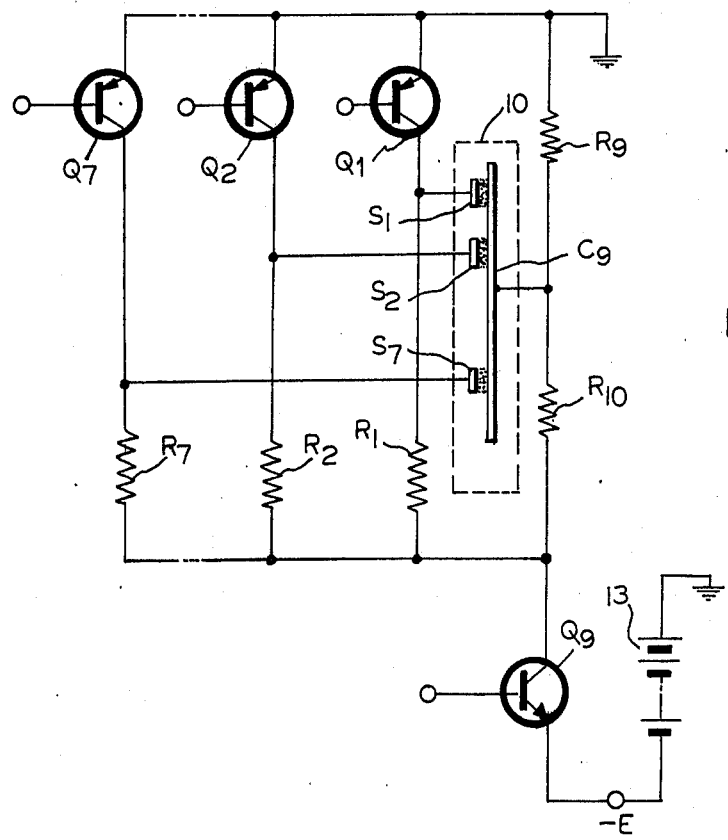
FIG. 2 is a circuit diagram of an embodiment of a basic driving circuit for a display panel according to the present invention.

FIG. 2 shows a basic driving circuit according to the present invention for driving a display panel 10 as shown in FIG. 1. which is driven by both polarities of the applied voltage. Segment driving transistors $Q_1$, $Q_2$ . . . $Q_7$ are connected between ground and the corresponding segmental electrodes $S_1$, $S_2$ . . . $S_7$ for driving these segmental electrodes, respectively. A display controlling device $Q_9$, which in this instance is an N-P-N transistor, is connected between resistive elements $R_1$, $R_2$, $R_7$ and $R_{10}$ and a D.C. voltage applying means 13. The resistive element $R_{10}$ has a resistance equal to that of a resistive element $R_9$ connected between the common electrode $C_9$ and ground.

When an input signal is applied to the display controlling device $Q_9$ so as to place it in a short-circuit condition, the voltage-E of the D.C. voltage applying means 13 is divided by the resistive elements $R_9$ and $R_{10}$, and so the voltage of the common electrode $C_9$ becomes—E/2. At the same time, the voltage of the segmental electrodes $S_1$, $S_2$ . . . $S_7$ becomes zero or —E depending upon whether the segment driving devices $Q_1$, $Q_2$ . . . $Q_7$ are in the short-circuited condition or in an open circuit condition. Therefore, the voltage across the common electrode $C_9$ and the segmental electrodes $S_1$, $S_2$ . . . $S_7$ becomes +E/2 or —E/2.

By controlling the respective segment driving devices $Q_1$, $Q_2$ . . . $Q_7$ according to the pattern of a numeral which it is desired to display, the display panel 10 is caused to display the numeral in one color or the other of the electrophoretic material and the suspending medium. When the display controlling $Q_9$ is in an open circuit condition, the voltage of the common electrode $C_9$ becomes zero. At this time, the voltage of the segmental electrodes $S_1$, $S_2$ . . . $S_7$ becomes zero regardless of the condition of the segment driving devices $Q_1$, $Q_2$ . . . $Q_7$. Therefore, the segmental electrodes $S_1$, $S_2$ . . . $S_7$ are not driven, and the display condition of the display panel 10 is retained by the memory characteristic thereof.

Figure 3:
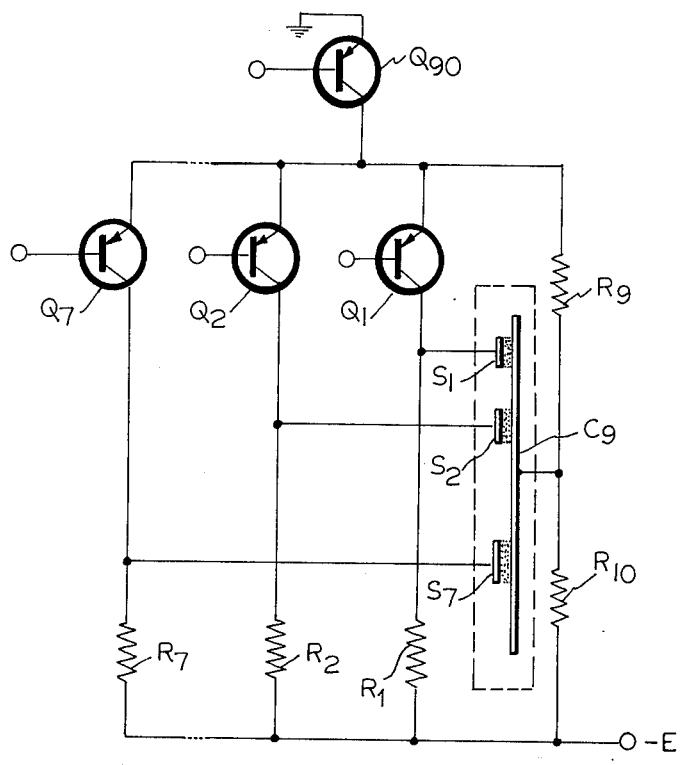
FIG. 3 shows another embodiment of the basic driving circuit of the invention.

A modification of the basic driving circuit of the invention is shown in FIG. 3, in which the same reference numerals designate the same components as those of FIG. 2, respectively. It is similar to the circuit to FIG. 2 except that the display controlling devide $Q_9$ is replaced by a device $Q_{90}$, which in this instance is a P-N-P transmitter, and which is connected between ground and the segment driving devices $Q_1$, $Q_2$ . . . $Q_7$.

When an input signal is applied to the display controlling device $Q_{90}$ so as to place it in a short-circuited condition, the voltage of the common electrode $C_9$ become —E/2 since the voltage —E of the D.C. voltage supply means 13 is divided by the resistive elements $R_9$ and $R_{10}$ having equal resistance to each other. At the same time, the voltage of the segmental electrodes $S_1$, $S_2$ . . . $S_7$ becomes zero or —E depending upon whether the segment driving devices $Q_1$, $Q_2$ . . . $Q_7$ are in the short-circuited condition or in the open circuit condition. Therefore, the voltage across the common electrode $C_9$ and the segmental electrodes becomes +E/2 or —E/2.

Similarly to FIG. 2, when the display controlling device $Q_{90}$ is in the short-circuited condition, the voltage of the common electrode $C_9$ become —E, and also the voltage of the segmental electrodes $S_1$, $S_2$ . . . $S_7$ becomes —E regardless of the condition of the segment driving device $Q_1$, $Q_2$ . . . $Q_7$. Therefore, the voltage across the common electrode $C_9$ and the segmental electrodes $S_1$, $S_2$ . . . $S_7$ becomes zero, so that these segmental electrodes are not driven and the display panel 10 continues to indicate a numerical pattern which was previously provided by the short-circuited conditon of the display controlling device $Q_{90}$.

It is obvious that similar operation can be achieved even when the polarity of the segment driving device, the display controlling device and the D.C. voltage supply means are reversed simultaneously.

Figure 4:
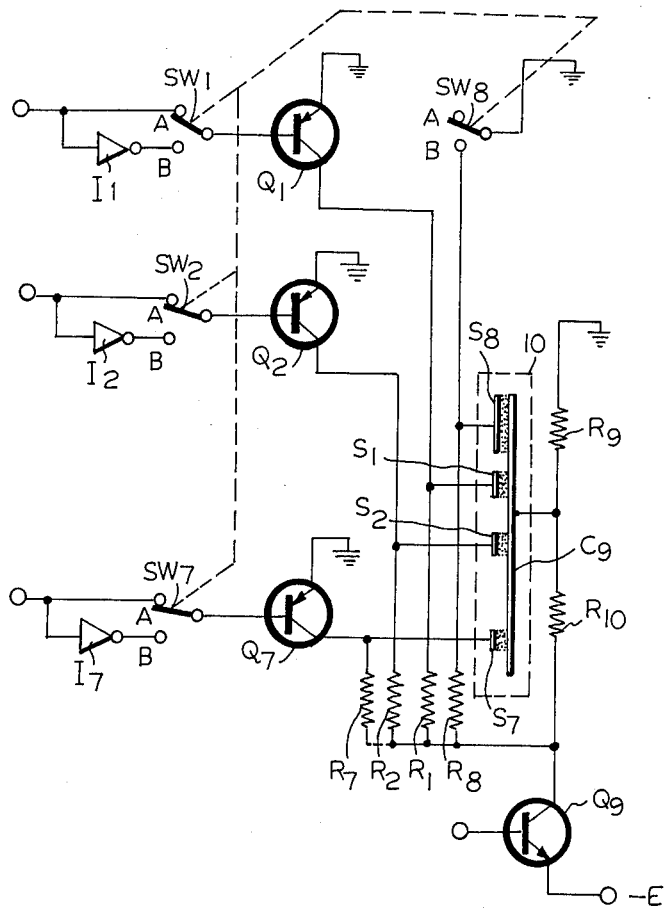
FIG. 4 shows another embodiment of the invention having a switching circuit for changing the color of the segmental electrodes and the background electrode of the display panel.

FIG. 4 shows another embodiment of the invention having a switching circuit therein, in which similar reference numerals designate similar components to those of the foregoing figures. In FIG. 4, interlocking switching devices $SW_1$ to $SW_7$ are connected between input terminals and the segment controlling devices, respectively so as to change the polarity of the input signal to the segment driving device. When the switches $SW_1$ to $SW_7$ are in a position (A), the input signals are directly transmitted to the segment driving devices. When the switches $SW_1$ to $SW_7$ are in a position (B), the input signals having the reverse polarity which have been inverted by inverters $I_1$ to $I_7$ are applied to the segment driving devices. Another switching device $SW_8$ is connected between the ground and the background electrode $S_8$ so as to control the voltage of the background electrode $S_8$.

When the display controlling device $Q_9$ is in the short-circuited condition and the switches $SW_1$ to $SW_8$ are in the position (A) the voltage across the common electrode $C_9$ and the segmental electrodes $S_1$ to $S_7$ becomes +E/2 or —E/2 depending upon whether the segment driving devices $Q_1$ to $Q_7$ are in the short-circuited condition or in the open circuit condition. In this case since the switch $SW_8$ is open, the voltage of the background electrode $S_8$ becomes —E/2. When the background electrode $S_8$ a black color, the display panel 10 displays a white numerical pattern on a black background.

On the other hand, when the display controlling device $Q_9$ is in the short-circuited condition and the switches $SW_1$ to $SW_7$ are in the position (B), the polarity of the voltage across the common electrode $C_9$ and the segmental electrodes $S_1$ to $S_7$ becomes opposite to that of the condition described above. Also, the polarity of the voltage across the common electrode $C_9$ and the background electrode $S_8$ is reversed by switching the position of the switching device $SW_8$ to (B). Accordingly, the display panel 10 displays a black numeral on a white background.

Figure 5:
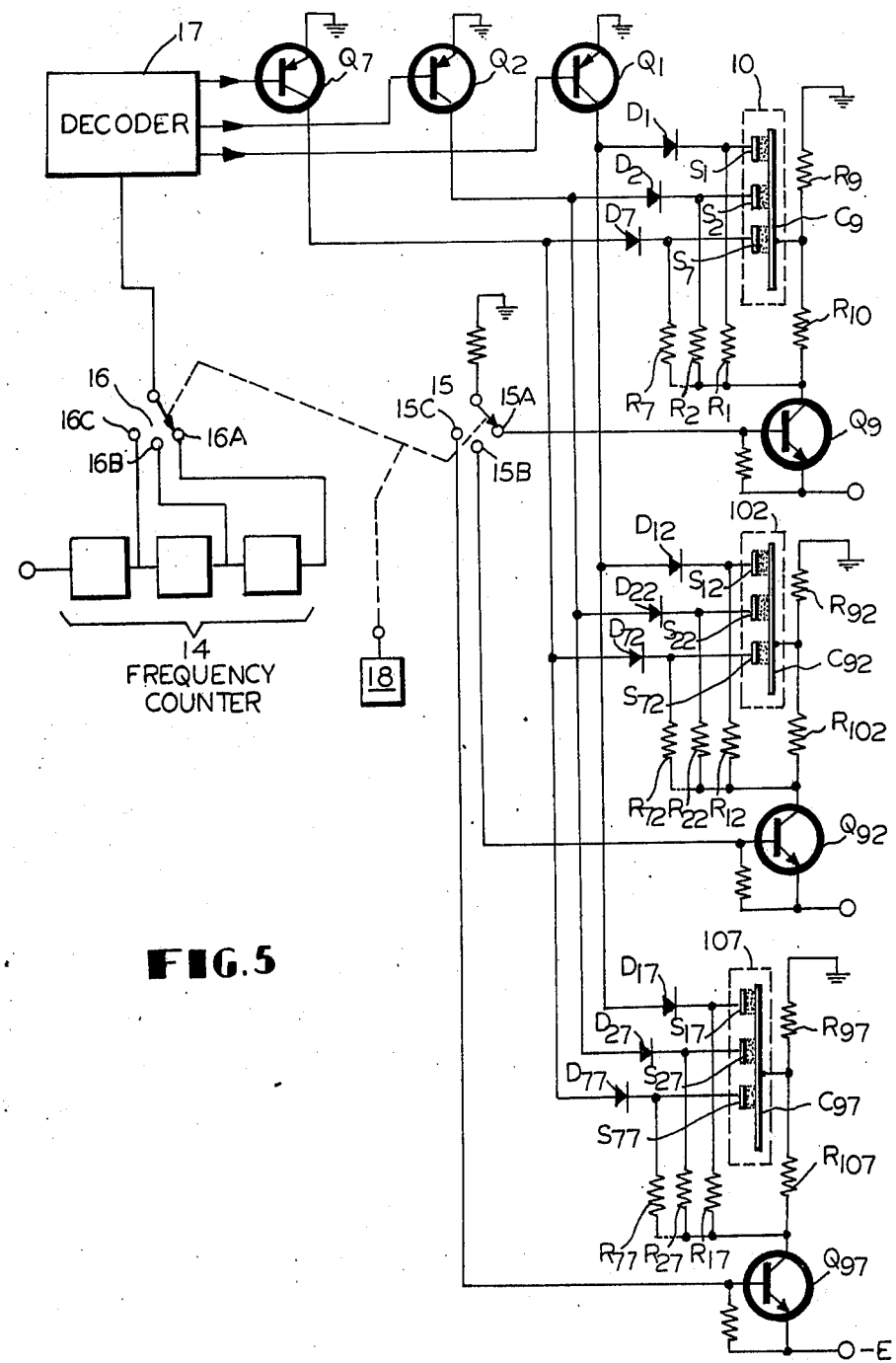
FIG. 5 shows still another embodiment of the invention for driving three display panels alternately.

Another embodiment of the invention is shown in FIG. 5, in which similar reference numerals designate similar components to those of the foregoing figures. The driving circuit of FIG. 5 includes a frequency counter device 14 for counting a number of the input pulses, synchronizing switching devices 15 and 16 and a synchronizing pulse generator 18 which generates pulses for driving the synchronizing switching devices 15 and 16. Each digit output of the frequency counter 14 is connected to terminals 16A, 16B and 16C of the synchronizing device 16. A common terminal of the synchronizing switching device is connected to a decoder 17 which decodes an input pulse code. For example, the decoder 17 decodes a binary decimal code (BCD code) into a seven segment code. The output signal of the decoder 17 drives the segment driving devices $Q_1, Q_2 \ldots Q_7$, similarly to the foregoing figures.

There are provided three display controlling devices $Q_9, Q_{92}$ and $Q_{97}$, which in this instance are N-P-N- transistors, for controlling the respective display panel 10, 102 and 107. The inputs to the respective display controlling devices $Q_9, Q_{92}$ and $Q_{97}$ are connected to terminals 15A, 15B and 15C of the synchronizing switching device 15, respectively. The common terminal of the synchronizing switching device 15 is connected to ground through a resistive element.

By changes in the position of the synchronizing switching device 15, the display controlling devices $Q_9$, $Q_{92}$ and $Q_{97}$ are placed in the short-circuited condition in turns, and each of the display panels 10, 102 and 107 is driven in turn. Therefore, the numbers corresponding to the input pulses are displayed on the display panels. As described hereinbefore, the display on the display panel is maintained even during the time it is not driven by the memory function thereof.

In FIG. 5. unilateral impedance devices $D_1, D_2 \ldots D_7$; $D_{12}, D_{17}, D_2, D_{22} \ldots D_{27}$; and $D_{17}, D_{72} \ldots D_{77}$ are provided for preventing interference of the display panels with each other. For the synchronizing switching devices 15 and 16, conventional shift registers are used.

Figure 6:
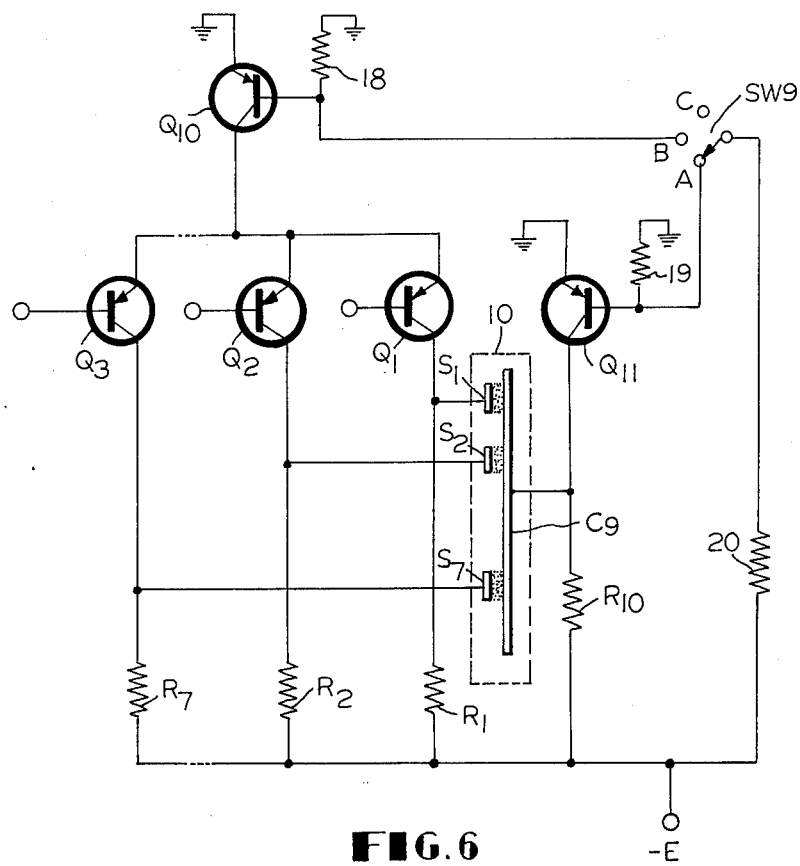
FIG. 6 shows still another embodiment of the invention having an indicating controlling circuit and an erasing controlling circuit.

Referring to FIG. 6 in which similar reference numerals designate similar components to those of the foregoing figures, there is provided a switching device $SW_9$ so as to control an erasing device $Q_{11}$, which in this instance is a P-N-P transistor and a display controlling device $Q_{10}$ which corresponds to device $Q_{90}$ of FIG. 3. The erasing device $Q_{11}$ is connected between the ground and the common electrode $C_9$ of the display panel 10. The display controlling device $Q_{10}$ is connected between the ground and the segment driving devices $Q_1, Q_2 \ldots Q_7$.

In a position (A) of the switching device $SW_9$, the erasing device $Q_{11}$ is in the short-circuited condition and so the voltage of the common electrode $C_9$ is zero. At this time, as the display controlling device $Q_{10}$ is in the open circuit condition, the voltage cross the common electrode $C_9$ and the segmental electrodes $S_1, S_2 \ldots S_7$ becomes $-E$ regardless of the condition of the segment controlling devices $Q_1, Q_2 \ldots Q_7$. Accordingly, all displays of the segmental electrodes $S_1, S_2 \ldots S_7$ are eased. That is, the color of the panel becomes black as described hereinbefore referring to FIG. 1.

In a position (B) of the switching device $SW_9$, the erasing device $Q_{11}$ is in the open circuit condition and so the voltage of the common electrode $C_9$ becomes $-E$. Since the display controlling device $Q_{10}$ is in the short-circuited condition, the voltage across the common electrode $C_9$ and the segmental electrodes $S_1, S_2 \ldots S_7$ becomes $+E$ or $-E$ depending upon whether the segment driving devices $Q_1, Q_2 \ldots Q_7$ are in the short-circuited condition or in the open circuit condition. The segment electrode having the voltage of $+E$ displays a white color and the segment having the voltage of $-E$ displays a black color.

In a position (C) of the switching device $SW_9$, since both the display controlling device $Q_{10}$ and the erasing device $Q_{11}$ are in the open circuit condition, the voltage of the common electrode becomes $-E$, and also the voltage of the segmental electrodes becomes $-E$ regardless of the condition of the segment driving device. Therefore, none of the segmental electrodes are driven, and the display panel 10 continues to display the same information as that displayed for the position (B) of the switching device $SW_9$. When it is necessary to change the information, the switching device $SW_9$ is driven. The switching device $SW_9$ is a conventional shift register.

Figure 7:
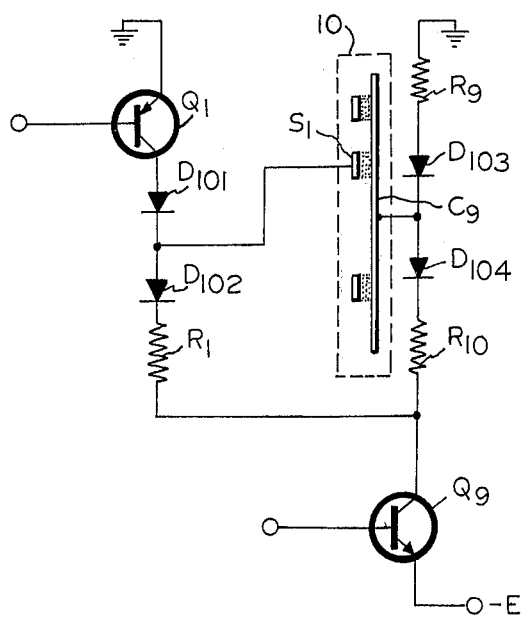
FIG. 7 shows a part of the circuit for another embodiment of the invention for improving the memory characteristic of the display panel.

Referring to FIG. 7 in which similar reference numerals designate similar components to those of the foregoing figures, there are provided unilateral impedance devices $D_{101}, D_{102}, D_{103}$ and $D_{104}$ for improving the memory characteristic of the display panel 10. The unilateral impedance device $D_{101}$ is connected between the segment driving device $Q_1$ and the segmental electrode $S_1$. $D_{102}$ is connected between the segmental electrode $S_1$ and the resistive element $R_1$. $D_{103}$ is connected between the resistive element $R_9$ and the common electrode $C_9$. $D_{104}$ is connected between the resistive element $R_{10}$ and the common electrode $C_9$. Diodes or transistors are used, for example, for these unilateral impedance devices. The memory characteristic of the display panel 10 is improved by making the outside impedance between the segment electrode and the common electrode as large as possible.

When the display controlling device $Q_9$ is in the open circuit condition, there is no current flowing through the unilateral impedance devices $D_{101}, D_{102}, D_{103}$ and $D_{104}$. Since these impedance devices have a large impedance, each of the impedances of the segment driving device $Q_1$ and the resistive elements $R_1, R_9$ and $R_{10}$ is neglected. Then, the outside impedance between the segmental electrode $S_1$ and the common electrode $C_9$ is very large, and so there is provided the good memory characteristic. Although only the segmental electrode $S_1$ is discussed in the above for clarity of illustration, the same arrangement is used for the other segmental electrodes.

Figure 8:
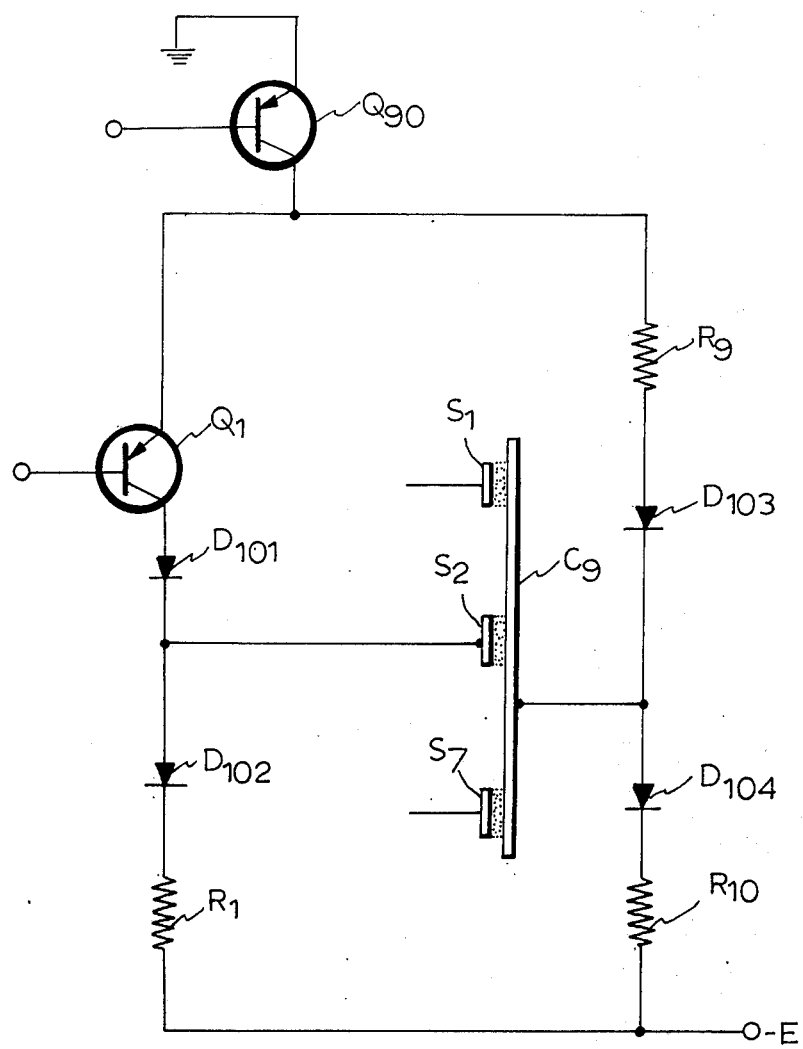
FIG. 8 shows a part of the arant for another embodiment of the invention for improving the memory characteristic of the display panel.

FIG. 7 is a modification of the device of FIG. 2, and it is also possible to provide a similar modification for the device of FIG. 3. Such a modification is shown in FIG. 8. In this case, the impedance device $D_{102}$ is connected between the segmental electrode $S_1$ and the power supply means $-E$.

Although the display of a numerical pattern is illustrated in FIG. 1 and described in the foregoing description, it will be readily understood that the display device of the invention can be used not only for a numerical display, but also for any other display such as a character, a mark or an advertising display.

What is claimed is:

1. A display device of the type which is required to be operated by both polarities of voltage supplied thereto, said display device comprising:
   a display panel including a segmented electrode having a plurality of segmental electrodes, a common electrode, and an electrophoretic suspension sandwiched between said common electrode and each of said segmental electrodes;

a plurality of segment driving devices, one each connected to one of said segmental electrodes;

a voltage supply means for supplying a D.C. voltage to said display panel;

a display controlling device coupled in series with said voltage supply means and the respective segment driving devices and in series with said voltage supply means and said common electrode;

a first resistive element having two ends, one end being connected to each of said segmental electrodes;

a second resistive element having two ends, one end of said second resistive element being connected to said common electrode and a second end of said second resistive element being connected to a second end of said first resistive element;

a third resistive element having two ends, one end of said third resistive element being connected to said plurality of segment driving devices and a second end of said third resistive element being connected to said common electrode;

said display controlling device comprising means for providing a voltage across said segmental electrodes and said common electrode through said segment driving devices only when said display controlling device is in a short-circuited condition;

said electrophoretic suspension between said common electrode and one of said segmental electrodes being driven so as to display an indication when said display controlling device and one of said segment driving devices connected to said one of said segmental electrodes are in a short-circuited condition; and said indication of said electrophoretic suspension being erased when said one of said segment driving devices reaches an open-circuited condition and said display controlling device returns to the short-circuited condition.

2. A display device as claimed in claim 1, wherein said display controlling device is connected to said segment driving devices; and wherein said display device further comprises a plurality of first and second unilateral impedance means, and a third and a fourth unilateral impedance means; one of said first unilateral impedance means being connected between each segmental electrode and the corresponding segment driving device; one of said second unilateral impedance means being connected between each segmental electrode and said voltage supply means; said third impedance means being connected between said common electrode and said voltage supply means; and said fourth impedance means being connected between said common electrode and said display controlling device; whereby the outside impedance between said segmental electrodes and said common electrode is made large.

3. A display device as claimed in claim 1, wherein said display controlling device is connected between said voltage supply means and said first and second resistive elements; and wherein said display device further comprises a plurality of first and second unilateral impedance means, and a third and a fourth unilateral impedance means; one each of said first unilateral impedance means being connected between one of said segmental electrodes and the corresponding segment driving device; one each of said second impedance means being connected between one of said segmental electrodes and said display controlling device; said third impedance means being operatively connected between said common electrode and said voltage supply means; and said fourth impedance means being connected between said common electrode and said display controlling device; whereby the outside impedance between said segmental electrodes and said common electrode is made large.

4. A display device as claimed in claim 1, wherein said display panel further comprises a background electrode; a first polarity-reversing switching means coupled to said segment driving devices for selecting a direct input signal or an inverted input signal for controlling said segment driving devices; and a second polarity-reversing switching means connected to said background electrode of said display panel and mechanically connected with said first polarity-reversing switching means for simultaneous reversing therewith.

5. A display device as claimed in claim 1, wherein said display device further comprises a frequency counter means for counting the number of input pulses; a decoder means coupled to said frequency counter means and to the respective segment driving devices for decoding an input pulse code from said frequency counter means and controlling the respective segment driving devices; first and second synchronizing switching devices which are mechanically synchronized with each other; a synchronizing pulse generator means coupled to said switching devices for generating pulses to drive said first and second synchronizing switching devices; and the input of said decoder means being coupled to said second synchronising switching device for control thereby.

6. A display device as claimed in claim 1, wherein said display device further comprises an erasing device and a switching device; said erasing device being connected to said common electrode of said display panel; said switching device being coupled between said erasing device, said common electrode and said display controlling device; and said display controlling device being connected to said segment driving devices and being controlled by said switching device.

* * * * *